United States Patent
Xie et al.

(10) Patent No.: US 12,183,406 B2
(45) Date of Patent: *Dec. 31, 2024

(54) ELIMINATING WRITE DISTURB FOR SYSTEM METADATA IN A MEMORY SUB-SYSTEM

(71) Applicant: Micron Technology, Inc., Boise, ID (US)

(72) Inventors: Tingjun Xie, Milpitas, CA (US); Zhenming Zhou, San Jose, CA (US); Zhenlei Shen, Milpitas, CA (US); Charles See Yeung Kwong, Redwood City, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/238,850

(22) Filed: Aug. 28, 2023

(65) Prior Publication Data
US 2023/0402108 A1 Dec. 14, 2023

Related U.S. Application Data

(63) Continuation of application No. 17/411,278, filed on Aug. 25, 2021, now Pat. No. 11,790,998.

(51) Int. Cl.
| | | |
|---|---|---|
| *G11C 11/34* | (2006.01) | |
| *G11C 16/08* | (2006.01) | |
| *G11C 16/10* | (2006.01) | |
| *G11C 16/24* | (2006.01) | |
| *G11C 16/26* | (2006.01) | |
| *G11C 16/34* | (2006.01) | |

(52) U.S. Cl.
CPC .......... *G11C 16/3418* (2013.01); *G11C 16/08* (2013.01); *G11C 16/102* (2013.01); *G11C 16/24* (2013.01); *G11C 16/26* (2013.01)

(58) Field of Classification Search
CPC ..... G11C 16/28; G11C 16/22; G11C 11/5642; G11C 7/062; G11C 16/0483
USPC .......................... 365/185.21, 189.16, 189.14
See application file for complete search history.

(56) References Cited

U.S. PATENT DOCUMENTS

| | | | | |
|---|---|---|---|---|
| 9,842,660 | B1* | 12/2017 | Karamcheti | ........ G06F 11/0781 |
| 11,037,638 | B1* | 6/2021 | Papagianni | ........... G06F 3/0653 |
| 2008/0109612 | A1 | 5/2008 | Jones | |
| 2012/0072768 | A1 | 3/2012 | Morris | |
| 2016/0139833 | A1 | 5/2016 | Chang | |
| 2018/0262215 | A1 | 9/2018 | Sharon | |

(Continued)

OTHER PUBLICATIONS

PCT Notification of Transmittal Of The International Search Report And The Written Opinion Of The International Searching Authority for PCT Application No. PCT/US2022/041406, mailed Dec. 6, 2022, 10 pages.

*Primary Examiner* — Son T Dinh
(74) *Attorney, Agent, or Firm* — Lowenstein Sandler LLP

(57) ABSTRACT

It is determined whether a write disturb capability associated with a first location of a memory device satisfies a threshold criterion. Responsive to determining that the write disturb capability associated with the first location of the memory device satisfies the threshold criterion, a plurality of memory units is remapped to a second location of the memory device, wherein a write disturb capability associated with the second location of the memory device does not satisfy the threshold criterion.

20 Claims, 8 Drawing Sheets

(56) References Cited

U.S. PATENT DOCUMENTS

2019/0303283 A1  10/2019  McGlaughlin
2020/0066360 A1   2/2020  Eno
2021/0216446 A1   7/2021  Yang

* cited by examiner

| Deck Number | Deck Address Bit Pair | | Deck Number | Remapped Deck Address Bit Pair |
|---|---|---|---|---|
| 0 | (0,0) | ↑ | 3 | (1,1) |
| 1 | (0,1) | | 1 | (0,1) |
| 2 | (1,0) | | 2 | (1,0) |
| 3 | (1,1) | | 0 | (0,0) |

Identify a plurality of memory units residing in a first location of a memory device 404

Determine that a write disturb capability associated with the first location of the memory device satisfies a threshold criterion 406

Remap a plurality of logical addresses associated with the plurality of memory units to a second location of the memory device 408

ELIMINATING WRITE DISTURB FOR SYSTEM METADATA IN A MEMORY SUB-SYSTEM

RELATED APPLICATIONS

The present application is a continuation of co-pending U.S. patent application Ser. No. 17/411,278, filed on Aug. 25, 2021, which is incorporated herein by reference in its entirety for all purposes.

TECHNICAL FIELD

Embodiments of the disclosure relate generally to memory sub-systems, and more specifically, relate to eliminating write disturb for system metadata in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 is an example table illustrating a remapping of a logical address of a layer of a memory device to another layer of the memory device, in accordance with some embodiments of the present disclosure.

DETAILED DESCRIPTION

Figure 1:
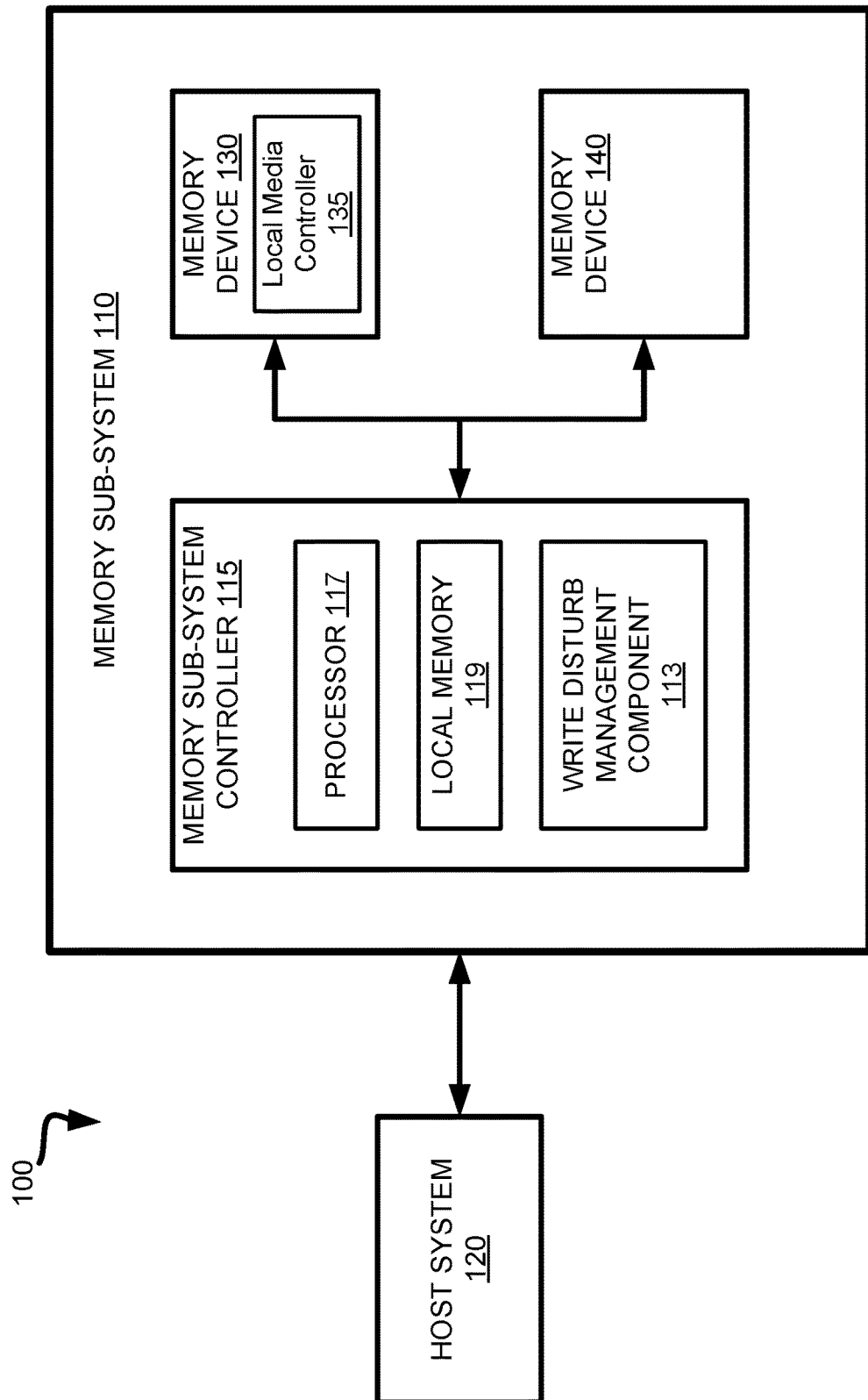
FIG. 1 illustrates an example computing system that includes a memory sub-system in accordance with some embodiments of the present disclosure.

Aspects of the present disclosure are directed to eliminating write disturb for system metadata in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Another example of non-volatile memory devices is a three-dimensional cross-point ("3D cross-point") memory device that is a cross-point array of non-volatile memory that can perform bit storage based on a change of bulk resistance, in conjunction with a stackable cross-gridded data access array. Other examples of non-volatile memory devices are described below in conjunction with FIG. 1. A non-volatile memory device is a package of one or more dies. Each die can include a set of partitions. A partition is a structure on a die that allows for concurrent media operations. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information.

A memory device can be made up of bits arranged in a two-dimensional or three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

The memory device can include one or more units of memory. Each memory unit can include one or more memory cells (e.g., a page, a block, or some other translation unit (TU)). Depending on the cell type, a cell can store one or more bits of binary information, and has various logic states that correlate to the number of bits being stored. The logic states can be represented by binary values, such as "0" and "1", or combinations of such values.

In certain memory devices, when data is written to a memory unit, adjacent (e.g., contiguous, neighboring, nearby, next to, etc.) memory units can experience what is known as "write disturb." Write disturb is the result of continually writing data to a particular memory unit without writing and/or refreshing data stored at nearby memory units, causing the nearby memory units to change state over time (e.g., the programmed state changes). If too many write operations are performed on the particular memory unit (also referred to as the "aggressor" hereinafter), data stored at adjacent or proximate memory units (also referred to as the "victim" hereinafter) of the memory device can become corrupted or incorrectly stored. The heat generated from the aggressor unit during the write operations can cause the memory alloy of the victim unit to crystalize, degrading its quality. Thus, in traditional memory sub-systems, a higher error rate can result when reading the data stored at the adjacent or proximate memory units. The higher error rate (e.g., raw bit error rate, or RBER) from write disturb can cause uncorrectable error correction code (UECC) errors, which can result in a loss of the data stored at the victim memory units. Thus, there can be a decrease in the reliability of data due to write disturb. The higher error rate can also increase the use of an error detection and correction operation (e.g., an error correction operation) for subsequent operations (e.g., read and/or write) performed on the memory unit. The increased use of the error correction operation can result in a reduction of the performance of the memory sub-system. As more resources of the memory sub-system are used to perform the error control operation, fewer resources can be used to perform other read operations or write operations. Thus, the performance of the memory sub-system can be decreased as fewer read operations and write operations can be performed within a particular amount of time.

Due to intrinsic product design and thermal transfer mechanism in certain memory devices, the write disturb effect can be different based on the direction from which the write disturb effect arrives at a given memory unit. For example, a victim memory unit can safely tolerate write disturb aggressions in one direction (e.g., a horizontal direction on a bitline) but can have more serious damage from write disturb aggressions in another direction (e.g., a vertical direction on a wordline). Additionally, the write disturb effect can also exhibit variations based on the layer of memory units where the memory unit is located. For example, a victim memory unit can safely tolerate write disturb aggressions on one layer of memory units, but another victim memory unit on another layer of memory units can experience a stronger write disturb effect from write disturb aggressions. A layer can be a deck of memory cells within a set of decks of a memory device, a plane within the memory device, or any other group of memory cells within the memory device. Accordingly, a write disturb elimination mechanism that takes into account the location of the memory unit as well as the direction of the write disturb can be desired.

In certain memory devices, victim memory units storing non-host data (e.g., system metadata) can be more susceptible to write disturb aggressions than victim memory units storing host data. System metadata can be more susceptible to write disturb aggressions because write operations are performed less on memory units storing system metadata than on memory units storing host and/or user data. System metadata can include critical information for a memory device, such as drive parameters and statistics, system management information, logical block address to physical block address mapping table information, etc. Without access to system metadata, a memory device could fail.

Certain memory sub-systems typically place memory units storing system metadata on either a set of bitlines or a set of wordlines of a set of partitions of a memory device. However, due to an address-scrambling mechanism of certain memory devices, the memory units storing system metadata can be scattered throughout each partition. There is thus a possibility that memory units storing system metadata can be placed adjacent to memory units storing host and/or user data. In such cases, the memory units storing system metadata can experience write disturb when write operations are performed on the adjacent memory units storing host data.

In another example, certain memory sub-systems typically add an address-descrambling mechanism to the design described above. This allows for the memory units storing system metadata to be placed in a consecutive order along either a set of wordlines or bitlines of a set of partitions. Although this minimizes the risk that memory units storing system metadata will be placed next to an aggressor memory unit storing host and/or user data, there is still a possibility that the last memory unit storing system metadata can be adjacent to an aggressor memory unit. Thus, the last memory unit can experience write disturb effect when write operations are performed on the adjacent aggressor memory unit.

Aspects of the present disclosure address the above and other deficiencies by providing a memory sub-system that eliminates write disturb for system metadata in a memory device. In certain embodiments, a memory sub-system controller can identify a set of memory units residing in a layer of the memory device. The memory sub-system controller can determine that a write disturb capability associated with the layer of the memory device satisfies a threshold criterion (e.g., a memory unit residing in the layer of the memory device experiences a noticeable data quality degradation, or UECC, in response to a threshold number of write disturb attacks). The write disturb capability can be based on offline media characterization of the memory device. In response to determining that the write disturb capability satisfies the threshold criterion, the memory sub-system controller can remap a set of logical addresses associated with the set of memory units to another layer of the memory device. In certain embodiments, the other layer of the memory device can be associated with a write disturb capability that does not satisfy the threshold criterion (e.g., a memory unit residing in the other layer of the memory device does not experience a noticeable data quality degradation, or UECC, in response to the threshold number of write disturb attacks). In certain embodiments, the memory sub-system controller can identify one or more physical addresses corresponding to one or more memory cells of a set of memory units of a set of partitions of the memory device. The memory sub-system controller can store the set of memory units on a set of bitlines (or, alternatively, on a set of wordlines) of the set of partitions based on the one or more physical addresses. The memory sub-system can determine that a number of memory cells of the set of memory units stored on a bitline of the set of bitlines satisfies a condition (e.g., the number of memory cells is less than a threshold number of memory cells). In response to determining that the number of memory cells of the set of memory units satisfies the condition, the memory sub-system controller can store another set of memory units on the same bitline. The other set of memory units can include memory cells storing dummy data, thus providing a cushion between the set of memory units storing metadata and aggressor memory units.

Advantages of the present disclosure include, but are not limited to fully eliminating write disturb for system metadata on a memory device without a decrease in performance or increase in cost. As discussed herein above, the current solutions in conventional memory sub-systems do not fully eliminate write disturb for system metadata due to the risk that memory units storing system metadata can be placed adjacent to aggressor memory units. Unlike current solutions, aspects of the present disclosure enable a memory sub-system controller to take advantage of the differences in write disturb effect on victim memory units in different layers of a memory device due to the physical and electrical characteristics of the memory device as discussed above. The memory sub-system controller can remap victim memory units from one layer of the memory device that is prone to write disturb effect to another layer of the memory device that is not prone to write disturb effect. Remapping victim memory units to a layer of the memory device that is not prone to write disturb effect fully eliminates the potential for write disturb effect on the victim memory units storing system metadata, thereby improving the reliability and performance of the memory device. Aspects of the present disclosure also enable a memory sub-system to add one or more memory units with dummy data between victim memory units and aggressor memory units, thus eliminating the risk of write disturb to the victim memory units.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. Some types of memory, such as 3D cross-point, can group pages across dice and channels to form management units (MUs).

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a write disturb management component 113 that can eliminate write disturb for system metadata of a memory device (e.g., the memory device 130). In some embodiments, the memory sub-system controller 115 includes at least a portion of the write disturb management component 113. In some embodiments, the write disturb management component 113 is part of the host system 110, an application, or an operating system. In other embodiments, local media controller 135 includes at least a portion of the write disturb management component 113 and is configured to perform the functionality described herein.

The write disturb management component 113 can identify a set of memory units residing in a layer of the memory device. The memory sub-system controller can determine that a write disturb capability associated with the layer of the memory device satisfies a threshold criterion (e.g., a memory unit residing in the layer of the memory device experiences a noticeable data quality degradation, or UECC, in response to a threshold number of write disturb attacks). In response to determining that the write disturb capability satisfies the threshold criterion, the memory sub-system controller can remap a set of logical addresses associated with the set of memory units to another layer of the memory device. In certain embodiments, the other layer of the memory device can be associated with a write disturb capability that does not satisfy the threshold criterion (e.g., a memory unit residing in the other layer of the memory device does not experience a noticeable data quality degradation, or UECC, in response to the threshold number of write disturb attacks). In certain embodiments, the memory sub-system controller can identify one or more physical addresses corresponding to one or more memory cells of a set of memory units of a set of partitions of the memory device. The memory sub-system controller can store the set of memory units on a set of bitlines of the set of partitions based on the one or more physical addresses. The memory sub-system can determine that a number of memory cells of the set of memory units stored on a bitline of the set of bitlines satisfies a condition (e.g., the number of memory cells is less than a threshold number of memory cells). In response to determining that the number of memory cells of the set of memory units satisfies the condition, the memory sub-system controller can store another set of memory units on the same bitline. The other set of memory units can include memory cells storing dummy data, thus providing a cushion between the set of memory units storing metadata and aggressor memory units. Further details with regards to the operations of the write disturb management component 113 are described below.

Figure 2A:
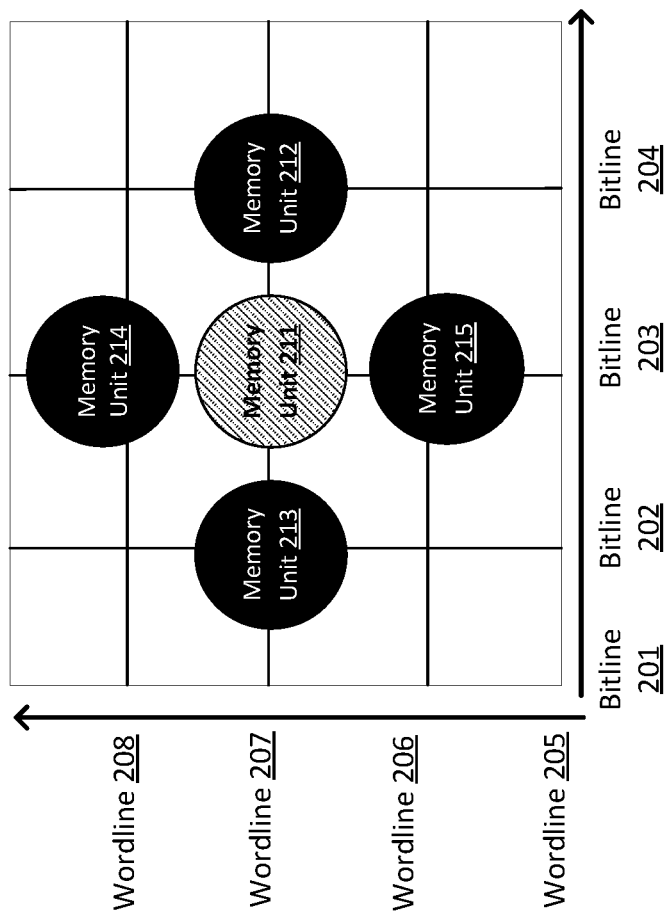
FIG. 2A illustrates an example memory unit causing a write disturb effect on adjacent memory units of a memory device, in accordance with some embodiments of the present disclosure.

FIG. 2A illustrates an example memory unit causing a write disturb effect on adjacent memory units of a memory device, in accordance with embodiments of the disclosure. In one implementation, a memory unit 211 is adjacent to a memory unit 214 and a memory unit 215 vertically on a bitline 203. Memory unit 211 is also adjacent to a memory unit 212 and a memory unit 213 horizontally on a wordline 207. In one implementation, the memory device can include a shared bitline having a number of pillars extending to a separate source line. Each pillar can be a vertical conductive trace and the intersections of each pillar and each wordline forms a memory unit (e.g., a memory cell). In this case, each memory unit has four adjacent neighboring memory units abutting its bitline-wordline intersection from the north, east, south, and west directions. In one implementation, the memory unit 211 can include one or more memory cells. The memory unit can store host or user data. In one implementation, the memory units 212, 213, 214, and 215 can include one or more memory cells. The memory units can store system metadata for the memory device.

In some implementations, when a write operation is performed to the memory unit 211, the voltage stage of each neighboring memory cell of each neighboring memory unit is altered, thus eventually resulting in a degree of distortion of data of the neighboring memory cells. In this case, memory unit 211 can be referred to as an aggressor, and its neighboring memory units 212-215 can be referred to as victims. In certain implementations, distortion of data of the victim memory units 212-215 can result in data loss as explained above. In certain memory devices and/or layers of the memory device that are prone to write disturb errors on bitlines, only memory units 215 and 214 on the bitline 203 experience write disturb errors as explained above. In certain memory devices and/or layers of the memory device that are prone to write disturb errors on wordlines, only memory units 212 and 213 on the wordline 207 experience write disturb errors as explained above. In some implementations, certain memory devices and/or layers of the memory device are prone to write disturb errors on neither bitlines nor wordlines but are prone to write disturb errors depending on the particular layer of the memory device, as explained in more detail herein above.

Figure 2B:
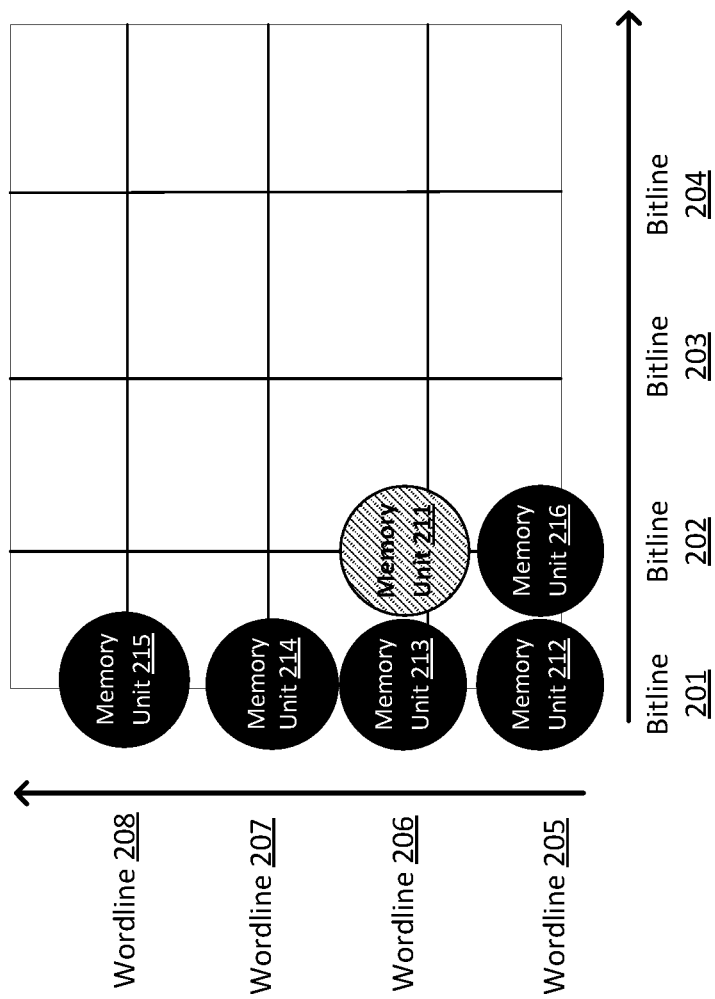
FIG. 2B illustrates an example memory unit causing a write disturb effect on adjacent memory units of a memory device, in accordance with some embodiments of the present disclosure.

FIG. 2B illustrates an example memory unit causing a write disturb effect on adjacent memory units of a memory device, in accordance with embodiments of the disclosure. In this example, the memory device can be prone to wordline write disturb errors. As discussed above, a current solution to mitigating write disturb for system metadata in certain memory devices is to place all memory units storing system metadata in consecutive order along either a set of bitlines or wordlines of a memory device. Placement of memory units on either a set of wordlines or bitlines of the memory device can be based on whether the memory device is prone to wordline write disturb errors or bitlines write disturb errors as discussed herein above. For example, as illustrated in FIG. 2B, memory units 212-215 can be placed on a bitline 201, where the number of memory units that each bitline can hold can be, e.g., four memory units. A memory unit 216 can be placed on a bitline 202. The memory units 212-216 can store, e.g., system metadata on one or more memory cells of the memory units 212-216. A memory sub-system controller can then place a memory unit 211 storing host or user data adjacent to the memory unit 216. In some implementations, when a write operation is performed to the memory unit 211, the voltage stage of each neighboring memory cell of each neighboring memory unit is altered, thus eventually resulting in a degree of distortion of data of the neighboring memory cells. In this case, memory unit 211 can be referred to as an aggressor, and its neighboring memory unit 216 can be referred to as a victim. In this example, the memory device in FIG. 2B is prone only to wordline write disturb errors. Thus, the adjacent memory unit to the aggressor memory unit 211 along a wordline is the memory unit 216, which would experience write disturb effect.

Figure 2C:
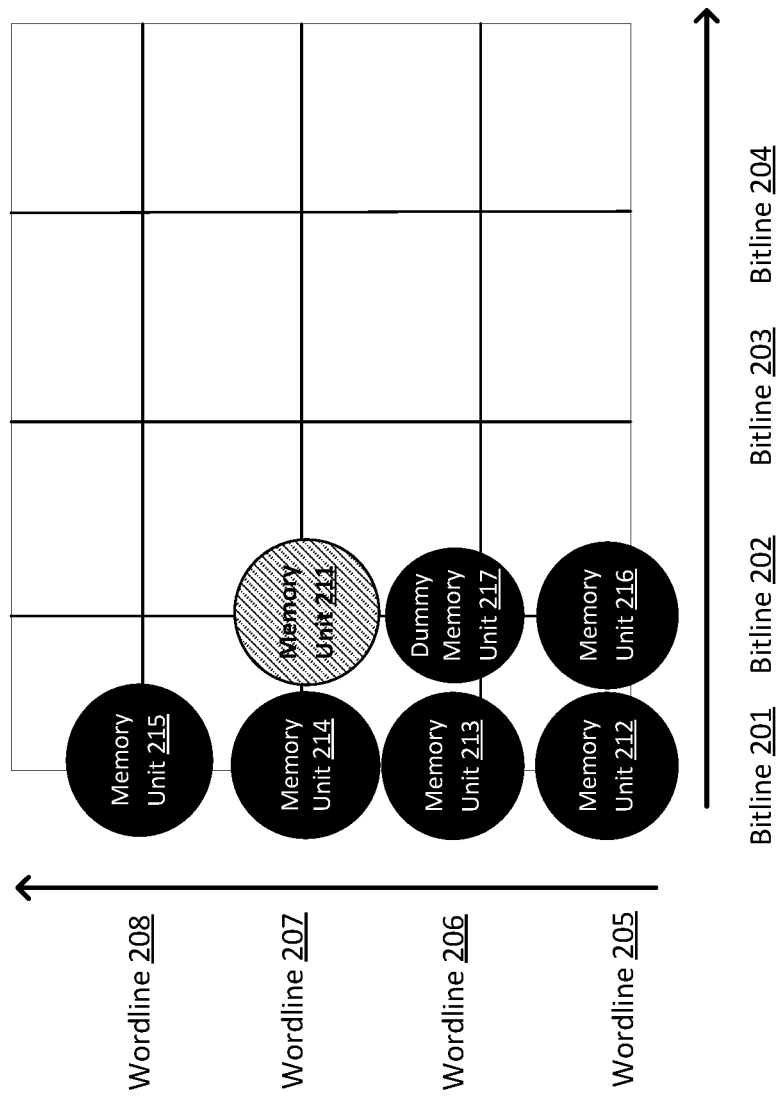
FIG. 2C illustrates an example memory unit directed to eliminating write disturb for memory units storing system metadata, in accordance with some embodiments of the present disclosure.

FIG. 2C illustrates an example memory unit directed to eliminating write disturb for memory units storing system metadata, in accordance with some embodiments of the present disclosure. As discussed herein above, memory units storing system metadata are more susceptible to write disturb effect than memory units storing host or user data. As illustrated in FIGS. 2A-2B, current solutions do not fully eliminate write disturb for memory units storing system metadata since there is always at least one memory unit with system metadata adjacent to an aggressor memory unit. In contrast, in some embodiments of the present disclosure, as illustrated in FIG. 2C, a memory sub-system controller can identify one or more physical addresses corresponding to one or more memory units (e.g., memory units 212-216). The memory sub-system controller can store the one or more memory units on one or more bitlines based on the one or more physical addresses. For example, the memory sub-system controller can place memory units 212-215 on a bitline 201, where the number of memory units that each bitline can hold can be, e.g., four memory units. Memory unit 216 can be placed on a bitline 202. The memory units can store system metadata for the memory device. In some embodiments of the present disclosure, a memory sub-system controller can write dummy data to a dummy memory unit 217 (e.g., a memory unit containing dummy data) which is adjacent to the memory unit 216 on the bitline 202. The memory sub-system controller can then sequentially store host or user data in a memory unit 211 that is adjacent to the memory unit 216 on the bitline 202. Thus, when write operations are performed on the memory unit 211, the adjacent memory unit is the dummy memory unit 217, thereby eliminating write disturb for the memory units 212-216 storing system metadata. In some examples, the memory sub-system controller can place multiple memory units storing dummy data to fill up an entire bitline. For example, the memory sub-system controller can place multiple memory units storing dummy data to fill up the bitline 202. The memory sub-system controller can then sequentially store host or user data in the memory unit 211 on a bitline 203, thereby eliminating write disturb for the memory units 212-216 since the memory unit 211 will not cause write disturb to the memory units 212-216. In this example, the memory device in FIG. 2C is prone only to wordline write disturb errors.

FIG. 3 is an example table illustrating a remapping of a logical address of a layer of a memory device to another layer of the memory device, in accordance with some embodiments of the present disclosure. Certain memory devices and/or layers of the memory device are not prone to write disturb errors on either bitlines or wordlines. Instead, write disturb effect can depend on a particular layer of the memory device. As such, in some embodiments of the present disclosure, a memory sub-system controller can identify a set of memory units residing a location of a memory device. The location of the memory device can correspond to a layer (e.g., a deck) of the memory device. For example, as illustrated in FIG. 3, the memory sub-system controller can identify a set of memory units residing at a deck 0. The memory sub-system controller can determine that a write disturb capability associated with the deck 0 satisfies a threshold criterion. For example, deck 0 can be prone to write disturb errors. In response to determining that the write disturb capability associated with the deck 0 satisfies the threshold criterion, the memory sub-system controller can remap a set of logical addresses associated with the set of memory units to another location of the memory device. The other location of the memory device can correspond to another layer (e.g., deck) of the memory device. The memory sub-system controller can determine that the other location does not satisfy the threshold criterion. For example, as illustrated in FIG. 3, the memory sub-system controller can remap a set of addresses of the set of memory units (e.g., a bit pair address (0,0) of the logical deck 0) to a deck 3, where the deck 3 does not satisfy the threshold criterion. For example, not satisfying the threshold criterion could include that deck 3 is not prone to write disturb errors. As discussed herein above, remapping a set of memory units from a write disturb error prone deck to a deck that is not prone to write disturb can fully eliminate write disturb for memory units storing system metadata.

Figure 4:
FIG. 4 is a flow diagram of an example method to eliminate write disturb for system metadata in a memory device, in accordance with some embodiments of the present disclosure.

FIG. 4 is a flow diagram of an example method 400 to eliminate write disturb for system metadata in a memory device, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the write disturb management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 404, the processing logic identifies a set of memory units residing in a location of the memory device. In some embodiments, the location of the memory device can correspond to a layer of a set of layers of the memory device. Each layer can correspond to a deck of a set of decks of the memory device. Each memory unit can comprise one or more memory cells. The one or more memory cells can store system metadata associated with the memory device. In some embodiments, the processing logic can identify the set of memory units based on a set of physical addresses associated with the set of memory units.

At operation 406, the processing logic determines that a write disturb capability associated with the location of the memory device satisfies a threshold criterion. In some embodiments, determining that the write disturb capability associated with the location of the memory device satisfies the threshold criterion can include determining that a memory unit residing at the location of the memory experiences a degradation in data quality or UECC in response to a threshold number of write disturb attacks. For example, the threshold number of write disturb attacks can be a number at which the memory unit residing at the location of the memory device would be considered prone to write disturb errors. The degradation in data quality can be, for example, a noticeable degradation in data quality. The threshold number of write disturb attacks can vary depending on the characteristics of the memory device.

At operation 408, the processing logic remaps a set of logical addresses associated with the set of memory units to another location of the memory device. In some embodiments, the other location of the memory device corresponds to another layer of the set of layers of the memory device. In some embodiments, remapping the set of logical addresses associated with the set of memory units to the other location of the memory device can include identifying the set of logical addresses associated with the set of memory units in a corresponding entry of a set of entries in a data structure associated with the memory device. The processing logic can determine that the logical address is associated with the location of the memory device described at operation 404 in the entry of the data structure. In response to determining that the logical address is associated with the location of the memory device in the entry of the data structure, the processing logic can update the entry of the data structure. In some embodiments, updating the entry of the data structure can include associating the logical address with the second location of the memory device. In some embodiments, the processing logic determines that the write disturb capability associated with the other location of the memory device does not satisfy the threshold criterion. Determining that the write disturb capability does not satisfy the threshold criterion can include determining that a memory unit residing at the other location of the memory device does not experience a degradation in data quality or UECC in response to a threshold number of write disturb attacks. For example, the threshold number of write disturb attacks can be a number at which memory unit residing at the other location of the memory device would be considered prone to write disturb errors. The degradation in data quality can be, for example, a noticeable degradation in data quality. The threshold number of write disturb attacks can vary depending on the characteristics of the memory device.

Figure 5:
FIG. 5 is a flow diagram of an example method to eliminate write disturb for system metadata in a memory device, in accordance with some embodiments of the present disclosure.

FIG. 5 is a flow diagram of an example method 500 to eliminate write disturb for system metadata in a memory device, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the write disturb management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 504, the processing logic identifies one or more physical addresses corresponding to one or more memory cells. The one or more memory cells can be part of a set of memory units of a set of partitions of the memory device. The one or more memory cells can store system metadata associated with the memory device.

At operation 506, the processing logic stores one or more memory units including the one or more memory cells on a set of bitlines of the set of partitions of the memory device. In some embodiments, the processing logic stores the one or more memory units on the set of bitlines based on the one or more physical addresses of the one or more memory cells. In some embodiments, storing the one or more memory units on the set of bitlines includes determining a consecutive order of the one or more memory cells based on the one or more physical addresses of the one or more memory cells. The processing logic can store data associated with the one or memory cells on the set of bitlines in the consecutive order. In some embodiments, the processing logic can store the one or more memory units on the set of bitlines in response to determining that the memory device and/or the set of partitions of the memory device is prone to wordline-to-wordline write disturb errors. Determining that the memory device and/or the set of partitions of the memory device is prone to wordline-to-wordline write disturb errors can be based on the physical and electrical characteristics of the memory device. In some embodiments, if the processing logic determines that the memory device and/or the set of partitions of the memory device is prone to bitline-to-bitline write disturb errors based on the physical and electrical characteristics of the memory device, the processing logic can store the one or more memory units on a set of wordlines of the set of partitions of the memory device.

At operation 508, the processing logic determines that a number of memory units stored on a bitline of the set of bitlines satisfies a condition. In some embodiments, determining that the number of memory units stored on the bitline satisfies the condition can include determining that the number of memory units stored on the bitline is less than a threshold number of memory units. For example, the threshold number of memory units can be a maximum amount of memory units that can be stored on a bitline of the memory device.

At operation 510, the processing logic stores another set of memory units including one or more memory cells on the bitline. In some embodiments, the other set of memory units includes dummy data. In some embodiments, the processing logic can store one memory unit with one or more memory cells including dummy data on the bitline. In some embodiments, the processing logic can store multiple memory units on the bitline such that the bitline stores the maximum amount of memory units that can be stored on the bitline. In some embodiments, the processing logic stores a third set of memory units adjacent to the other set of memory units including dummy data. One or more memory cells of the third set of memory units can include host data or user data. In some embodiments, if the processing logic determines that the memory device and/or the set of partitions of the memory device is prone to bitline-to-bitline write disturb errors based on the physical and electrical characteristics of the memory device, the processing logic can store the other set of memory units including dummy data on a wordline of a set of wordlines of the set of partitions of the memory device.

Figure 6:
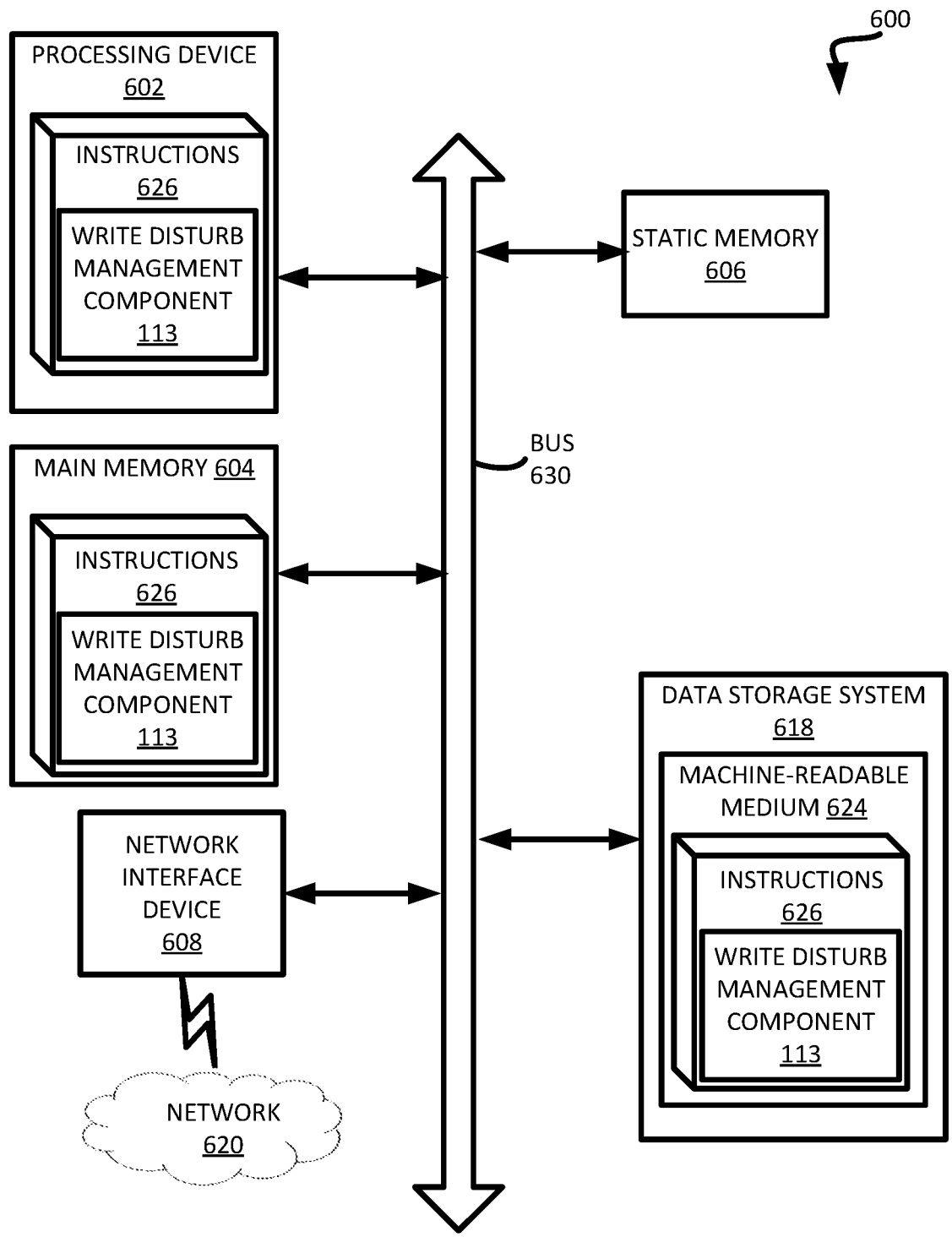
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the write disturb management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a write disturb management component (e.g., the write disturb management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
determining that a write disturb capability associated with a first location of the memory device satisfies a threshold criterion; and
responsive to determining that the write disturb capability associated with the first location of the memory device satisfies the threshold criterion, remapping a plurality of memory units residing in the first location to a second location of the memory device, wherein a write disturb capability associated with the second location of the memory device does not satisfy the threshold criterion.

2. The system of claim 1, wherein to remap the plurality of memory units to the second location of the memory device, the processing device is to perform operations comprising:
identifying each logical address of a plurality of logical addresses associated with the plurality of memory units in a corresponding entry of a plurality of entries of a data structure associated with the memory device;
determining that each logical address is associated with the first location of the memory device in the entry of the data structure; and
responsive to determining that each logical address is associated with the first location of the memory device in the entry of the data structure, updating the entry of the data structure, wherein updating the entry of the data structure comprises associating each logical address with the second location of the memory device.

3. The system of claim 1, wherein to determine that the write disturb capability associated with the first location of the memory device satisfies the threshold criterion, the processing device is to perform operations comprising:
determining that a memory unit residing in the first location of the memory device is associated with a data quality degradation in response to a threshold number of write disturb attacks.

4. The system of claim 1, wherein the processing device is to perform operations further comprising:
determining that the write disturb capability associated with the second location of the memory device does not satisfy the threshold criterion, wherein determining that the write disturb capability associated with the second location of the memory device does not satisfy the threshold criterion comprises determining that a memory unit residing in the second location of the memory device is not associated with a data quality degradation in response to a threshold number of write disturb attacks.

5. The system of claim 1, wherein each memory unit of the plurality of memory units comprises one or more memory cells storing system metadata associated with the memory device.

6. The system of claim 1, wherein the first location of the memory device corresponds to a first layer of a plurality of layers of the memory device, wherein the second location of the memory device corresponds to a second layer of the plurality of layers, wherein the plurality of layers comprises a plurality of decks of the memory device, wherein the first location of the plurality of memory units corresponds to a first deck of the plurality of decks where the plurality of memory units is located, and wherein the second location of the plurality of memory units corresponds to a second deck of the plurality of decks where the plurality of memory units is located.

7. A method comprising:
   determining that a write disturb capability associated with a first location of a memory device satisfies a threshold criterion; and
   responsive to determining that the write disturb capability associated with the first location of the memory device satisfies the threshold criterion, remapping a plurality of memory units residing in the first location to a second location of the memory device, wherein a write disturb capability associated with the second location of the memory device does not satisfy the threshold criterion.

8. The method of claim 7, wherein remapping the plurality of memory units to the second location of the memory device comprises:
   identifying each logical address of a plurality of logical addresses associated with the plurality of memory units in a corresponding entry of a plurality of entries of a data structure associated with the memory device;
   determining that each logical address is associated with the first location of the memory device in the entry of the data structure; and
   responsive to determining that each logical address is associated with the first location of the memory device in the entry of the data structure, updating the entry of the data structure, wherein updating the entry of the data structure comprises associating each logical address with the second location of the memory device.

9. The method of claim 7, wherein determining that the write disturb capability associated with the first location of the memory device satisfies the threshold criterion comprises determining that a memory unit residing in the first location of the memory device is associated with a data quality degradation in response to a threshold number of write disturb attacks.

10. The method of claim 7, further comprising:
    determining that the write disturb capability associated with the second location of the memory device does not satisfy the threshold criterion, wherein determining that the write disturb capability associated with the second location of the memory device does not satisfy the threshold criterion comprises determining that a memory unit residing in the second location of the memory device is not associated with a data quality degradation in response to a threshold number of write disturb attacks.

11. The method of claim 7, wherein each memory unit of the plurality of memory units comprises one or more memory cells storing system metadata associated with the memory device.

12. The method of claim 7, wherein the first location of the memory device corresponds to a first layer of a plurality of layers of the memory device, wherein the second location of the memory device corresponds to a second layer of the plurality of layers, wherein the plurality of layers comprises a plurality of decks of the memory device, wherein the first location of the plurality of memory units corresponds to a first deck of the plurality of decks where the plurality of memory units is located, and wherein the second location of the plurality of memory units corresponds to a second deck of the plurality of decks where the plurality of memory units is located.

13. A non-transitory computer-readable storage medium comprising instructions that, when executed by a processing device, cause the processing device to perform operations comprising:
    determining that a write disturb capability associated with a first location of a memory device satisfies a threshold criterion; and
    responsive to determining that the write disturb capability associated with the first location of the memory device satisfies the threshold criterion, remapping a plurality of memory units residing in the first location to a second location of the memory device, wherein a write disturb capability associated with the second location of the memory device does not satisfy the threshold criterion.

14. The non-transitory computer-readable storage medium of claim 13, wherein to remap the plurality of memory units to the second location of the memory device, the processing device is to perform operations comprising:
    identifying each logical address of a plurality of logical addresses associated with the plurality of memory units in a corresponding entry of a plurality of entries of a data structure associated with the memory device;
    determining that each logical address is associated with the first location of the memory device in the entry of the data structure; and
    responsive to determining that each logical address is associated with the first location of the memory device in the entry of the data structure, updating the entry of the data structure, wherein updating the entry of the data structure comprises associating each logical address with the second location of the memory device.

15. The non-transitory computer-readable storage medium of claim 13, wherein to determine that the write disturb capability associated with the first location of the memory device satisfies the threshold criterion, the processing device is to perform operations comprising:
    determining that a memory unit residing in the first location of the memory device is associated with a data quality degradation in response to a threshold number of write disturb attacks.

16. The non-transitory computer-readable storage medium of claim 13, wherein the processing device is to perform operations further comprising:
    determining that the write disturb capability associated with the second location of the memory device does not satisfy the threshold criterion, wherein determining that the write disturb capability associated with the second location of the memory device does not satisfy the threshold criterion comprises determining that a memory unit residing in the second location of the memory device is not associated with a data quality degradation in response to a threshold number of write disturb attacks.

17. The non-transitory computer-readable storage medium of claim 13, wherein each memory unit of the plurality of memory units comprises one or more memory cells storing system metadata associated with the memory device.

18. The non-transitory computer-readable storage medium of claim 13, wherein the first location of the memory device corresponds to a first layer of a plurality of layers of the memory device, and wherein the second location of the memory device corresponds to a second layer of the plurality of layers.

19. The non-transitory computer-readable storage medium of claim 18, wherein the plurality of layers comprises a plurality of decks of the memory device, wherein the first location of the plurality of memory units corresponds to a first deck of the plurality of decks where the plurality of memory units is located, and wherein the second location of the plurality of memory units corresponds to a second deck of the plurality of decks where the plurality of memory units is located.

20. The non-transitory computer-readable storage medium of claim 13, wherein the processing device is to perform operations further comprising:
    identifying the plurality of memory units residing in the first location of the memory device, wherein the first location of the memory device corresponds to a first layer of a plurality of layers of the memory device.

* * * * *